(12) United States Patent
Blaauw et al.

(10) Patent No.: US 6,195,628 B1
(45) Date of Patent: *Feb. 27, 2001

(54) WAVEFORM MANIPULATION IN TIME WARP SIMULATION (75) Inventors: David T. Blaauw; Nimish S. Radia, both of Austin, TX (US); Joseph F. Skovira, Owego, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/816,579

(22) Filed: Mar. 13, 1997

(51) Int. Cl.⁷ .................................................. G06F 17/50
(52) U.S. Cl. .............................. 703/16; 703/17; 707/102; 712/25
(58) Field of Search ................................ 395/500, 500.34, 395/500.35, 500.37; 364/578; 707/103, 102; 712/201, 25; 703/16, 17

(56) References Cited

U.S. PATENT DOCUMENTS

| | | | |
|---|---|---|---|
| 4,899,273 | 2/1990 | Omoda et al. ....................... | 364/200 |
| 4,901,260 | 2/1990 | Lubachevsky ....................... | 364/578 |
| 4,985,860 | 1/1991 | Vlach ................................. | 364/578 |
| 5,068,812 | 11/1991 | Schaefer et al. ..................... | 364/578 |
| 5,091,872 | 2/1992 | Agrawal .............................. | 364/578 |
| 5,157,620 | 10/1992 | Shaar ................................. | 364/578 |
| 5,220,512 | * 6/1993 | Watkins et al. ...................... | 364/489 |
| 5,272,651 | 12/1993 | Bush et al. ........................... | 364/578 |
| 5,295,065 | * 3/1994 | Chapman et al. .................... | 364/401 |
| 5,384,720 | 1/1995 | Ku et al. .............................. | 364/578 |

(List continued on next page.)

OTHER PUBLICATIONS

J. V. Briner, Parallel Mixed–Level Simulation of Digital Circuits Using Virtual Time, Ph.D. Thesis, Duke University, 1990.

D. R. Jefferson, "Virtual Time", in *ACM Transactions on Programming Languages and Systems*, vol. 7, No. 3, Jul. 1985, pp. 404–425.

J. V. Briner, Parallel Mixed–Level Simulation of Digital Circuits Using Virtual Time, Ph.D. Thesis, Duke University, 1990.

http://www.opampbooks.com/ELE_VHLD/14.html, p. 1.

Y Lin and E. D. Lazowska, "Determining the Global Virtual Time in a Distributed Simulation", in 1990 *International Confernce on Parallel Processing*, pp. III–201 to III–209.

P. Heidelberger, et al. "Parallel Simulation of Continuous Time Markov Chains Using Uniformization with Adaptive Rates." *IBM Technical Disclosure Bulletin*, vol. 36, No. 7, Jul. 1993, pp. 15–17.

P. Heidelberger, et al. "Parallel Simulation of Continuous Time Markov Chains Using Uniformization with Adaptive Rates." *IBM Technical Disclosure Bulletin*, vol. 36, No. 7, Jul. 1993, pp. 15–17.

(List continued on next page.)

*Primary Examiner*—Kevin J. Teska
*Assistant Examiner*—Thai Phan
(74) *Attorney, Agent, or Firm*—Shelley M Beckstrand (57) ABSTRACT

A system and method for manipulating waveforms, including transaction cancellation, in parallel time-warp simulation of circuits, such as those modeled in VHDL. Events waveforms for each output of a processor are organized by the simulation time (ST) of the events which created them and by the simulation time (RT) at which they are to be effective. A phantom buffer provides a linked list of events and associated transactions cancelled as a result of insertion of a new event in said chain of events. Rollback of a cancelled event waveform is done by restoring to the linked lists selected events and transactions from the phantom buffer.

14 Claims, 7 Drawing Sheets

U.S. PATENT DOCUMENTS

| | | | |
|---|---|---|---|
| 5,418,735 | | 5/1995 | Saitoh ................................ 364/578 |
| 5,442,772 | * | 8/1995 | Childs et al. ...................... 395/500 |
| 5,617,561 | * | 4/1997 | Blaauw et al. ..................... 395/500 |
| 5,649,164 | * | 7/1997 | Childs et al. ...................... 395/500 |
| 5,650,946 | * | 7/1997 | Trimberger ........................ 364/578 |
| 5,794,005 | * | 8/1998 | Steinman ........................... 395/500 |
| 5,801,938 | * | 9/1998 | Kalantery ........................... 364/131 |
| 5,832,272 | * | 11/1998 | Kalantery ........................... 395/706 |
| 5,956,261 | * | 9/1999 | Blaauw et al. ..................... 364/578 |

OTHER PUBLICATIONS

J. S. Steinman, "Synchronous Parallel System for Emulation and Discrete Event Simulation", CC No. US 7880211, Dialog File 351: Derwent WPI, Sep. 15, 1992, p. 1.

"What is Vast?", *http://www.mtl.com/projects/vast/vaspage2.html*, pp. 1–2.

* cited by examiner

WAVEFORM MANIPULATION IN TIME WARP SIMULATION

CROSS-REFERENCES TO RELATED APPLICATIONS

U.S. patent application Ser. No. 08/816,589, filed Mar. 13, 1997, entitled "In-Transit Message Detection for Global Virtual Time Calculation In Parallel Time Warp Simulation", filed concurrently herewith is assigned to the same assignee hereof and contains subject matter related, in certain respect, to the subject matter of the present application, and is incorporated herein by reference. U.S. Pat. No. 5,442,772 entitled "Common Breakpoint In Virtual Time Logic Simulation for Parallel Processors" also describes several terms and concepts useful in understanding the present invention, and is incorporated herein by reference.

BACKGROUND OF THE INVENTION

1. Technical Field of the Invention

This invention provides a system and method for circuit simulation. More particularly, it relates to a system and method for correct manipulation of waveforms in parallel time-warp simulations.

2. Background Art

The VHDL language is described in IEEE Standard VHDL Language Reference Manual, IEEE 1987. (VHDL refers to the VHSIC Hardware Description Language of IEEE standard 1076, where VHSIC means "very high speed integrated circuit.") The concept of time warp has been described by Jefferson. See, D. R. Jefferson, "Virtual time," in *ACM Transactions on Programming Languages and Systems*, pp. 404–425, July 1985.

During time-warp simulation of VHDL models it is possible that a simulation of an event on any processor (sometimes referred to as dispatcher) will schedule one or more transactions with simulation time less than the simulation time of already scheduled transactions (due to a simulation of previous events on processor's inputs) on an output of the processor. Such transactions will cancel one or more of the already scheduled transactions. This may happen because (i) of non-uniform propagation delays from the inputs of a logical process (also referred to simply as process) to its outputs and (ii) of the inertial delay model for the output. However, in time-warp simulation, the event generating new transactions, which canceled already scheduled transactions on the output, can get rolled back at some later time. In such a case we need to restore all the transactions which were canceled by the simulation of the rolled back event. Briner has proposed a solution for such event cancellation due to non-uniform propagation delay in switch-level time warp simulation of digital circuits which are not modeled in VHDL. See J. V. Briner, "Parallel Mixed-Level Simulation of Digital Circuits Using Virtual Time," Ph.D. thesis, Duke University, 1990. However, Briner's solution does not deal with the complexities of multiple waveform elements for an output and/or transaction cancellation due to inertial delay model.

Consequently, it is an object of the invention to provide a system and method for handling transaction cancellation, particularly for waveform elements.

It is a further object of the invention to provide a system and method for handling transaction cancellation due to the inertial delay model in time-warp simulation of circuits modeled in VHDL or any other such HDL, e.g., Verilog.

It is a further object of the invention to provide a parallel VHDL simulation method which will run on any number of parallel platforms, including a cluster of workstations such as a cluster of IBM RS/6000 systems interconnected with a switch, such as the Allnode switch described in U.S. Pat. No. 5,404,461, the teachings of which are incorporated herein by reference.

SUMMARY OF THE INVENTION

In accordance with this invention, a system and method is provided for forward simulation and rollback during time warp simulation of events by organizing waveforms for each output of a processor by the simulation time (ST) of the events which created them and by the simulation time (RT) at which they are to be effective.

Other features and advantages of this invention will become apparent from the following detailed description of the presently preferred embodiment of the invention, taken in conjunction with the accompanying drawings.

BEST MODE FOR CARRYING OUT THE INVENTION

This invention relates to a time warp based simulator for circuits modeled in VHDL.

Figure 1:
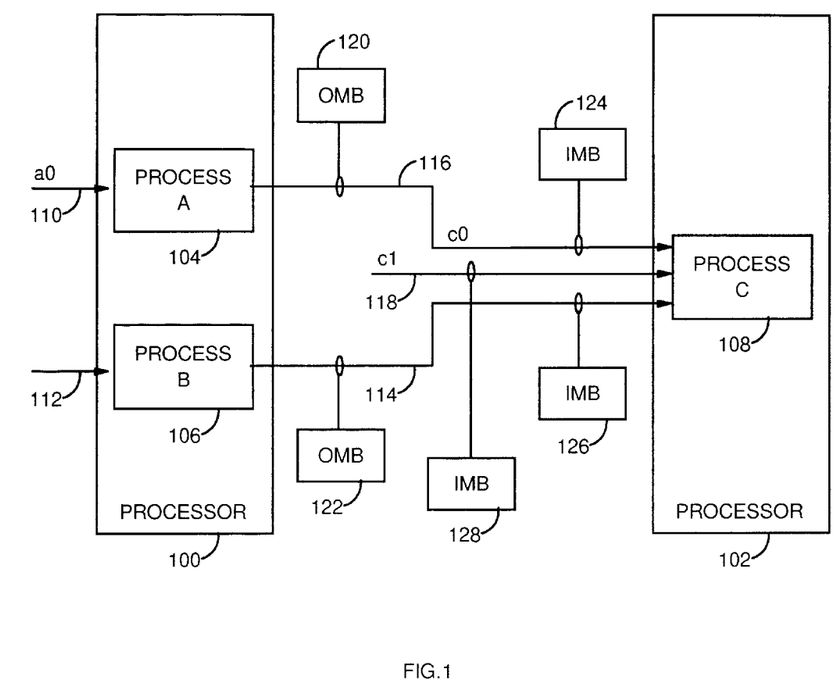
FIG. 1 illustrates a processor for simulating circuit models and sending events to a receiving processor.

Referring to FIG. 1, the model is represented by a set of processors 100, 102. (In simulation terminology, a processor is a computer node and may include one or more dispatchers, each dispatcher including one or more processes. For the purpose of this invention, however, there is no real need to distinguish processor and dispatcher, and the collection of processes will be referred to as a processor.) Processor 100 includes a cluster of processes 104, 106. Process A 104 receives input events as represented by line 110, simulates a circuit model and sends event messages represented by line 116 to process C 108 in receiving processor 102. Process B 106 receives input events represented by line 112, simulates a circuit model responsive to event 112, and sends resulting event messages represented by line 114 to process C 108.

Event messages from process A 104 are logged in output message buffer (OMB) 120; event messages from process B 106 are logged in OMB 122; event messages into process C 108 from process A 104 are logged in input message buffer (IMB) 124; and event messages into process C 108 from process B 106 are logged in IMB 126. Event messages into process C 108 on line C1 118 are logged in IMB 128.

In accordance with a more specific embodiment of the invention, each processor 100, 102 represents one or more VHDL process statements 104, 106, 108. Each processor 100, 102 is a cluster of processes; that is, code that simulates a collection of VHDL circuits and posts incoming events in an input message buffer (IMB) 124, 126, 128 and posts outgoing events on the output message buffer (OMB) 120, 122. While not shown, in a typical case when simulating a complex circuit, processor 102 would also send output messages, which would be logged to output message buffers; and, similarly, messages represented by lines 110, 112 into processor 100 may be logged to input message buffers (not shown.)

In accordance with a preferred embodiment of the invention, a set of algorithms and associated data structures are provided to efficiently handle the event cancellation and waveform manipulation for the outputs of each processor. A waveform event represents a device which generates many events into the future from a given input event.

For each processor 100, 102, each output is represented by a queue of messages called the output message buffer (OMB). This differs from the model proposed by Jefferson, supra, where all the outputs of a logical process are represented by only one entity. In accordance with this invention, one OMB 120, 122 per output 116, 114 is provided inasmuch as (1) each output has an associated waveform of transactions. That is, each transaction (also called an element) in the waveform is a value/simulation-time tuple representing a value on that output at some future simulation time, hereafter referred to as receive time (RT). And (2) the delay type associated with each output could be different, i.e., inertial vs. transport, and different delay models require different manipulation schemes for the waveform.

In accordance with this invention, the OMB 120, 122 associated with an output is updated whenever a new transaction is generated or an already scheduled transaction is added or removed from the OMB. Such communication occurs across processor boundaries, whether the processors are on separate processors or on the same processor.

Figure 2:
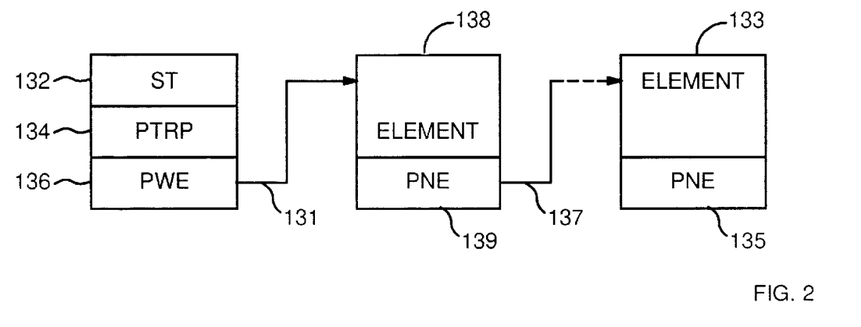
FIG. 2 illustrates the data structure to represent a multi-element waveform in an input message buffer.

Referring to FIG. 2, the data structure used to represent each entry 130 in the IMB is shown. Thus, IMB entry 130 includes send time (ST) field 132, pointer to previous entry (PTRP) field 134, and pointer to waveform elements (PWE) field 136. As is represented by line 131, PWE field 136 points to the next waveform element 138 in the IMB entry, which is associated with the next element pointer (PNE) field 139, which points, as is represented by line 137, to the next waveform element, and so on until a waveform element 133 is encountered with a PNE field 135 having a null entry.

Figure 3:
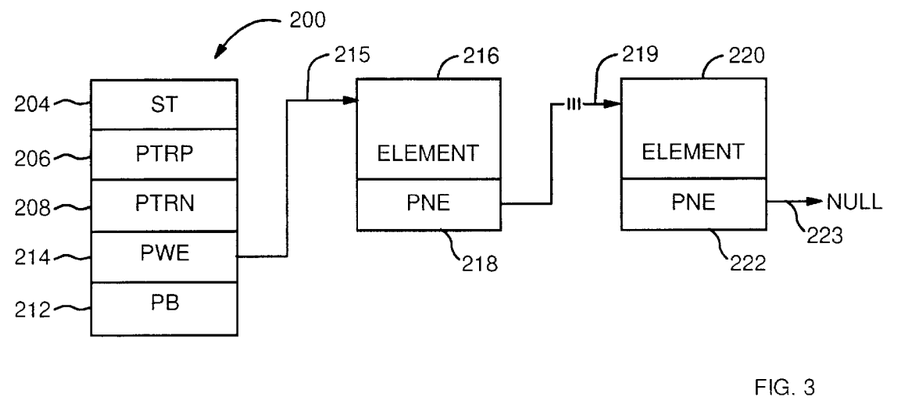
FIG. 3 illustrates the data structure to represent a multi-element waveform in an output message buffer.

Referring to FIG. 3, the data structure used to represent each entry in the OMB if the waveform will have more than one element is shown. In accordance with this data structure, an OMB entry (also referred to as box) includes a base structure 200 including send time (ST) field 204, pointer to previous entry (PTRP) field 206, pointer to next entry (PTRN) field 208, pointer to waveform elements (PWE) field 214, and pointer to phantom buffer (PB) field 212. As is represented by line 215, PWE field 214 points to the next waveform element 216 in the OMB entry (or, box), which is associated with next element pointer (PNE) field 218 which points, as is represented by line 219, to the next waveform element, and so on until a waveform element 220 is encountered associated with a PNE field 222 having a null entry, as is represented by pointer 223.

Figure 4:
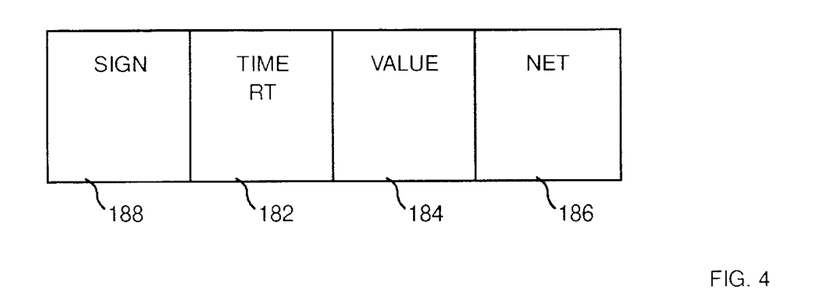
FIG. 4 illustrates the format of a message and its anti-message.

Referring to FIG. 4, messages 180 are generated in message pairs: a message M and an anti-message AM. In this embodiment, the IMB stores messages, and the OMB stores corresponding anti-messages. A message and its anti-message includes sign value field 188, receive time RT field 182, value field 184, and net field 186. A message and its anti-message are identical except for the value in sign value field 188, which will be opposite. The net field 186 identifies the input line 114, 116 to a process 108. For example, referring to FIGS. 5 and 6, message 176 "M for RT=23" corresponds to anti-message 330 "AM for RT=23", both having identical receive time RT=23 values in their respective fields 182, and opposite sign values in their respective sign fields 188.

Referring to Table 1 in connection with FIGS. 1 and 3, an overview of the concept of rollback will be provided. Table 1 represents a time wheel (a concept useful from serial processor simulation of logic circuits), wherein process C 108 is responsive to events on nets c0 116 and c1 118, and process A 104 is responsive to events on net a0 110. Each of processes A 104 and C 108 begin processing values independently on their respective nets a0 110 and c1 118, such that process C 108 processes the event at time 10 on net c1 at the same time as process A 104 processes the event at time 5 on net a0 110. Assume that the result of process A processing the event at time 5 is generate an event at time 7 which it places on net c0 116. Process C 108 must respond by rolling back to time 7 by canceling out its prior processing of the event at time 10.

TABLE 1

| Time Wheel | | |
| --- | --- | --- |
| TIME | VALUE | NET |
| 5 | 0 | a0 |
| 10 | 1 | a0 |
| 10 | 0 | c0 |
| 15 | 0 | a0 |
| 20 | 1 | a0 |

As will be described hereafter in connection with FIGS. 6 and 7, each OMB entry 202 is part of a doubly linked list and represents (1) the simulation time 204 of the event which generated the waveform, (2) the list of waveform elements 216, 220, which are ordered by their receive time (RT), and (3) a pointer to the phantom buffer (PB). A phantom buffer (PB) is a list of OMB entries representing the transactions (if any) canceled by the waveform represented by this OMB entry. All the entries in the OMB are ordered by the send time (ST) of the transactions; i.e., the simulation time of the event whose simulation generated these transactions. Also, in accordance with the method of the invention provided for inertial and transport delay, the OMB will always be ordered by the receive time (RT) of the transactions. Such ordering makes the insertion and deletion of the waveform elements quite efficient. Entries in the OMB can be accessed by a head pointer which points to the latest OMB entry in the doubly linked list of OMB entries.

Figure 5:
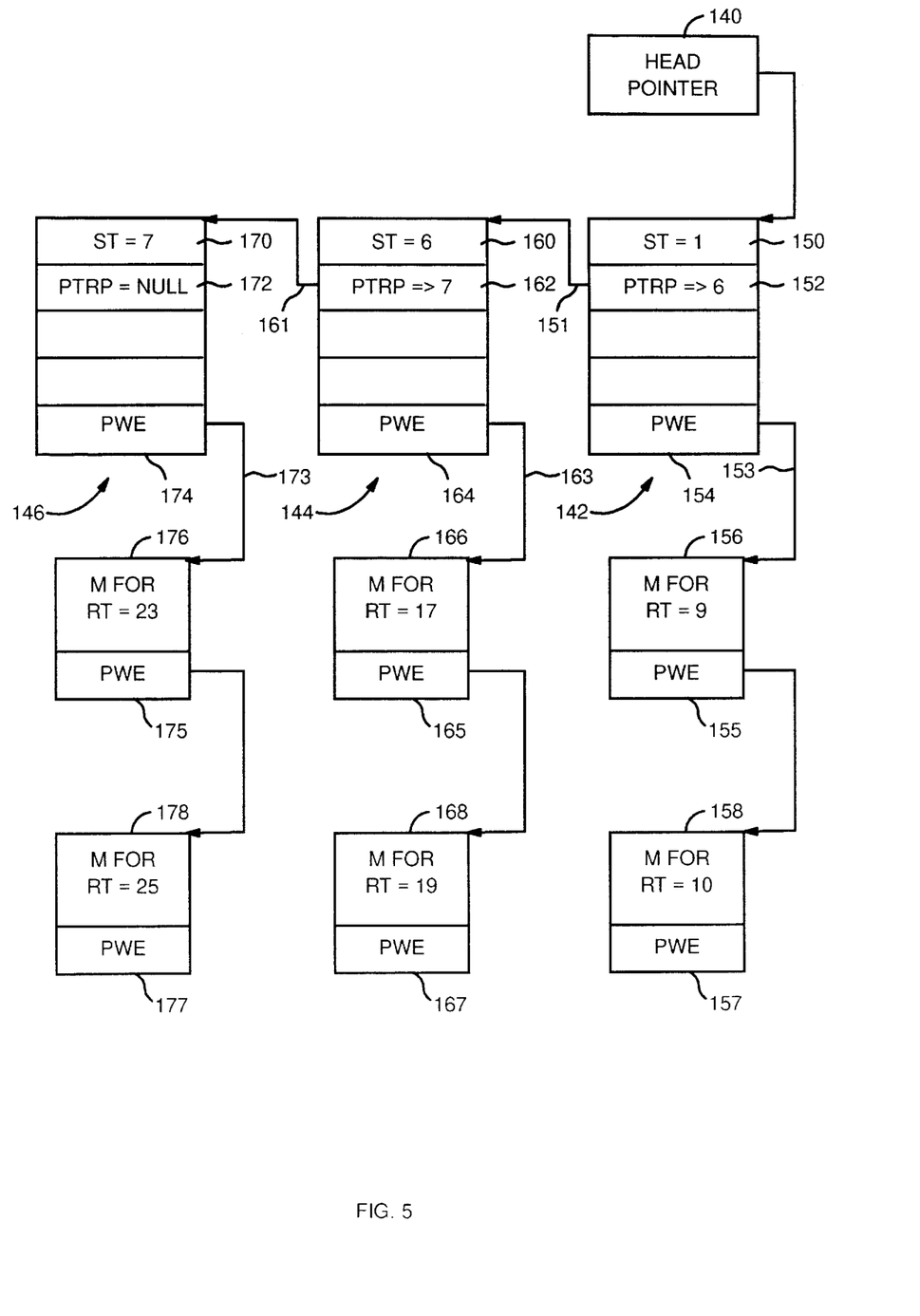
FIG. 5 is a diagrammatic representation of the input message buffer of FIG. 1.

Referring to FIG. 5, the structure of an IMB 120 is illustrated. As is represented by line 141, head pointer 140 points to the first element 142 in the chain of IMB elements 142, 144, 146. Element 142 includes send time ST=1 field 150, pointer PTRP=6 field 152, and pointer to waveform element PWE 154. Element 144 includes ST=6 field 160, PTRP=7 field 162, and PWE field 164. Element 146 includes ST=7 field 170, PTRP=null field 172, and PWE field 174. As is represented by lines 151 and 161, respectively, PTRP field 152 points to the element having send time ST=6, and PTRP field 162 points to the element having send time ST=7. PTRP field 172 being null indictates that element 146 is at the end of the pointer chain in the IMB.

As is represented by lines 153, 163, and 173, waveform element pointers 154, 164 and 174 point to waveform elements 156, 166, and 176 representing events receive times RT=9, RT=17 and RT=23, respectively. And these waveform elements are linked, respectively, to waveform elements representing events at receive times RT=10 158, RT=19 168, and RT=25 178—each of which is associated with a PWE field 157, 167, 177, respectively, set to null, indicating end of its respective waveform element chain.

Figure 6:
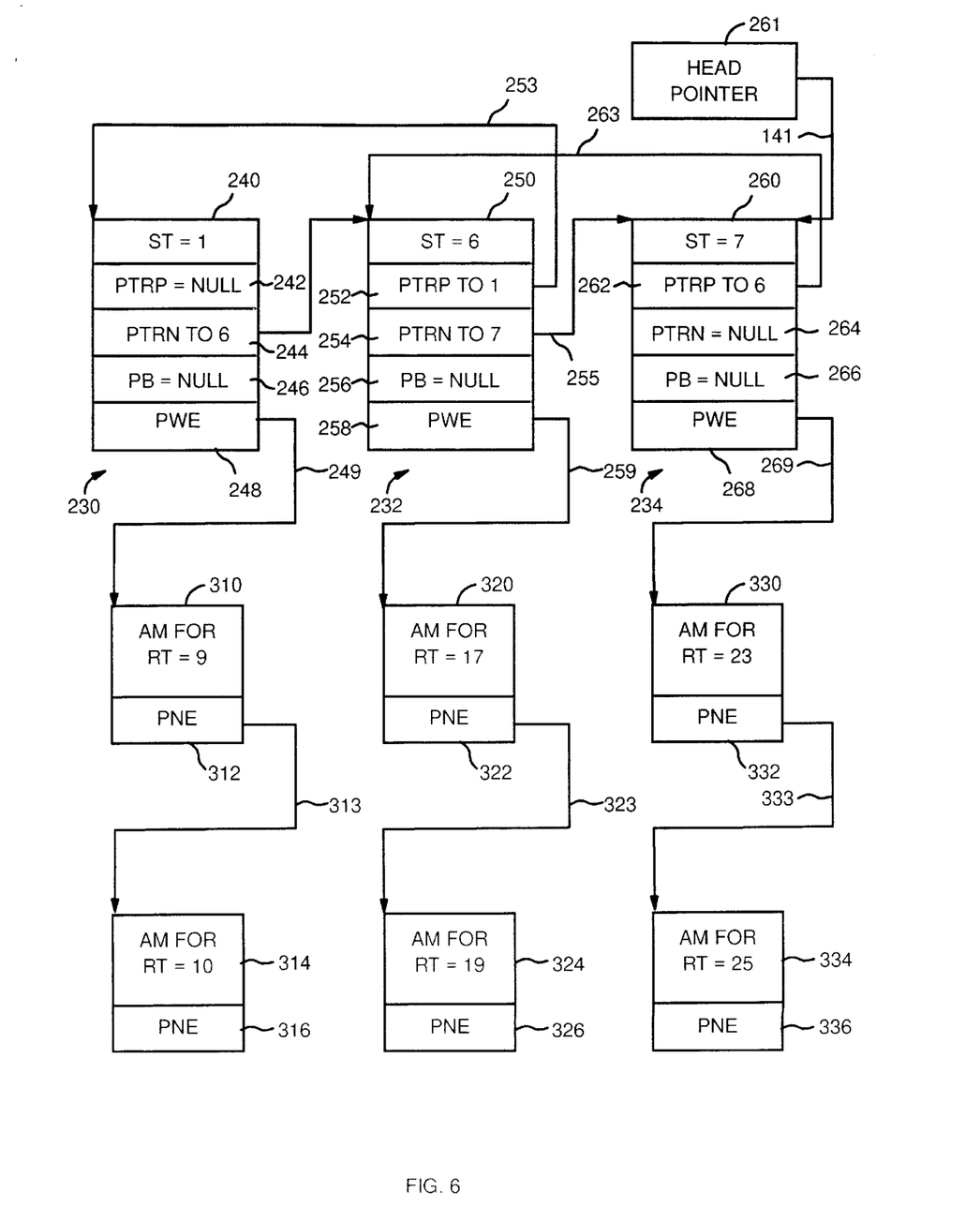
FIG. 6 is a diagrammatic illustration of the output message buffer of FIG. 1.

Referring now to FIG. 6, an example of an OMB 120 structured in accordance with a preferred embodiment of the invention is shown to represent forward simulation. An OMB 120 of a given processor 100 gets manipulated wherever a simulation of an event on a processor's inputs 110 generates new transaction(s) on the associated output 116. The example of FIG. 6 illustrates the need to manipulate the OMB due to a simulation of an event in a multi-element waveform OMB for the transport delay model.

In FIG. 6, a simulation of an event represented by OMB entry 230 with ST 240 field ST=1 has generated transactions with RT=9 310 and RT=10 314; a simulation of event 232 with ST=6 250 has generated transactions with RT=17 320 and RT=19 324; and a simulation of event 234 with ST=7 260 has generated transactions with RT=23 330 and RT=25 334. As shown in FIG. 6, these events and transactions are arranged in doubly linked lists, or queues, as follows. Entry 230 has PTRP field 242 set to null; PTRN field 244 points to entry 232 for ST=6, as is represented by line 245; PB field 246 is set to null; and PWE field 248 points to the AM for RT=9 310, as is represented by line 249. PNE field 312 points to the AM for RT=10 314, as represented by line 313. PNE field 316 is set to null.

OMB entry 232 for event ST=6 250 has PTRP field 252 linked to entry 230 for ST=1 240, as is represented by line 253; PTRN field 254 linked to entry 234 for event ST=7, as is represented by line 255; PB field 256 set to null; and PWE field 258 pointing to AM for RT=17 230, as is represented by line 259. PNE field 322 for RT=17 points to next transaction AM for RT=19 324, as is represented by line 323. PNE field 326 is set to null.

OMB entry 234 for event ST=7 260 has PTRP field 262 linked to entry 232 for ST=6 250, as is represented by line 263; PTRN field 264 set to null; PB field 266 set to null; and PWE field 268 pointing to AM for RT=23 330, as is represented by line 269. PNE field 332 for RT=23 points to next transaction AM for RT=25 334, as is represented by line 333. PNE field 336 is set to null.

Thus, the data structures and linked lists of FIG. 6 illustrate a simulation of an event at ST=7 that generates transactions with RT=23 and RT=25, a simulation of an event at ST=6 that has generated transactions with RT=17 and RT=19, and a simulation of an event at ST=1 that has generated transactions with RT=9 and RT=10. Head pointer 261 points to the head of the OMB, which is the element 234 with the greatest ST, ST=7 260.

FIG. 6 illustrates the state of the OMB before simulating the event with ST=8, which event generates a waveform with transactions at RT=18 and RT=20. As result of simulating the event at ST=8, part of the multi-element waveform at ST=6; i.e., the waveform 324 with RT=19, and the complete waveform at ST=7, including waveforms 330 with RT=23 and 334 with RT=25, should be canceled.

Figure 7:
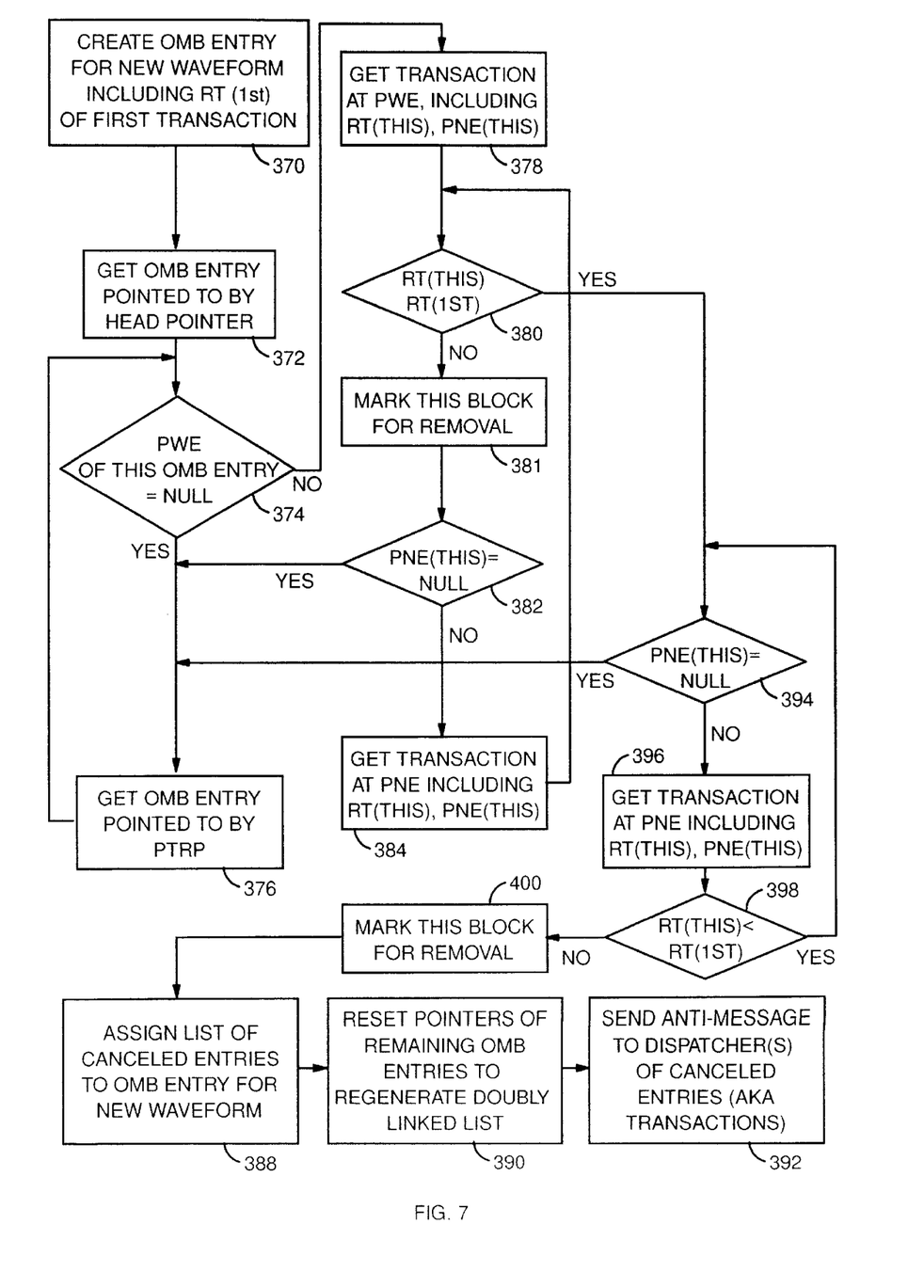
FIG. 7 is a flow chart of the method steps for inserting a new entry into an output message buffer.
Figure 8:
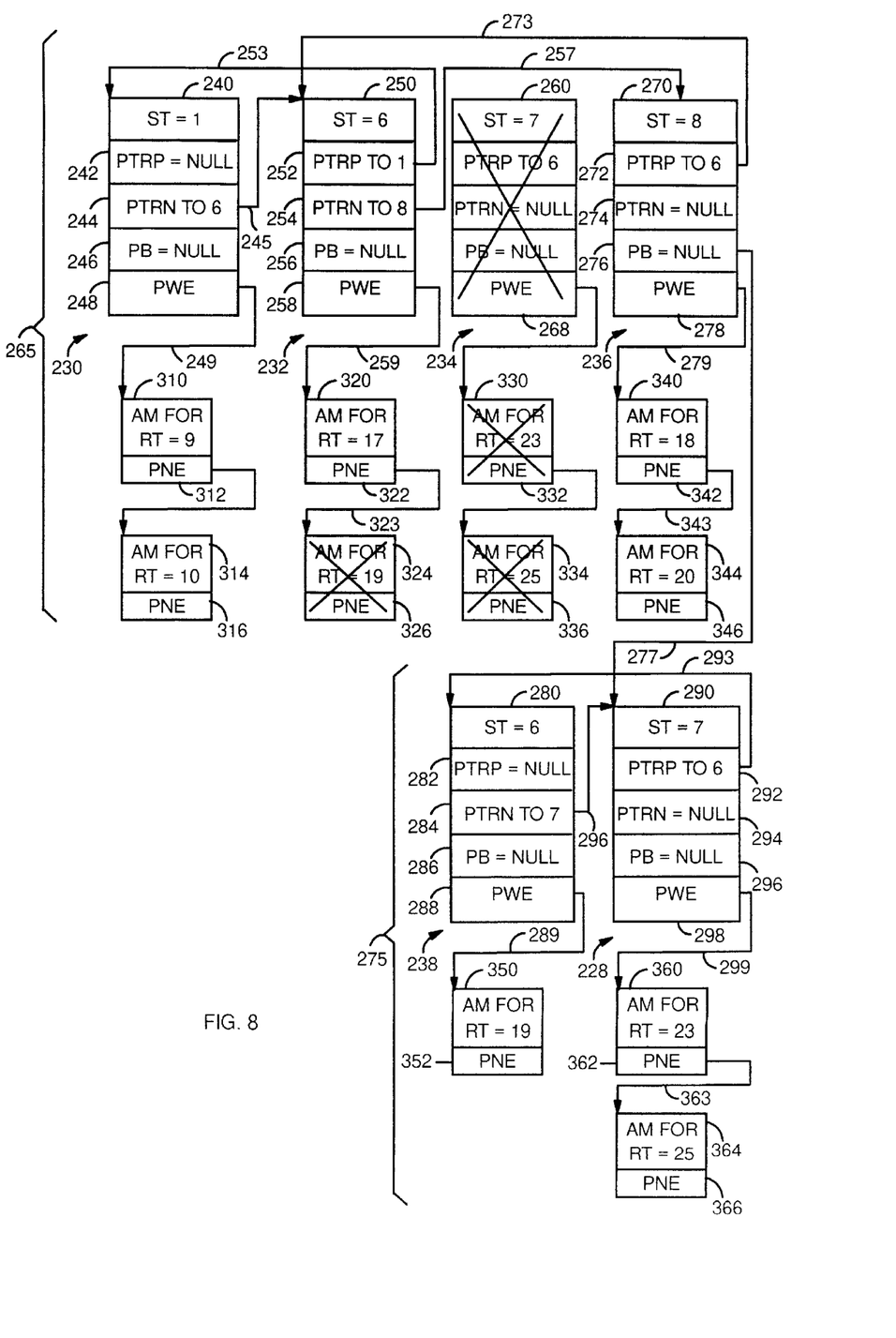
FIG. 8 is a diagrammatic illustration of the output message buffer of FIG. 6 including a phantom buffer resulting from insertion of a new event according to the method of FIG. 7.

Referring to FIG. 7 in connection with FIG. 8, the procedure for managing the OMB to achieve such cancellation is set forth.

In step 370, a new OMB entry 236 is created for the new waveform, including first waveform element RT=18 340, designated by RT(1st) in the flowchart of FIG. 7. Entry 236 includes ST=8 field 272, PTRP field 272, PTRN field 274, PB field 276 and PWE field 278. The values in fields 272 and 276 are initially null, and will be completed later, as will be explained hereafter. PWE field 278 points to AM for RT=18 340, and PNE 342 points 343 to AM for RT=20 field 344. PNE field 346 is set to null.

In steps 372 through 384, the HeadPtr traverses the OMB via PTRB to find the first OMB entry 232 with at least one transaction such that the RT of the transaction RT=17 322 (RT(this)) is less than RT=18 340 of the first transaction (RT(1st)) in the newly generated waveform 236, 340, 344. In the example of FIG. 6, this is the transaction 232 with RT=6 and RT=17 320, inasmuch as RT=18>RT=17. As the OMB entries are ordered by the RT as well as the ST, the search concludes at this point.

In further detail, in step 372, the OMB entry 234 pointed to by head pointer 261 is selected. In step 374, the PWE field 268 of the OMB entry 234 selected in step 372 is examined. If null, then there are no transactions in the waveform, and in step 376 the PTRP field 262 of the OMB selected in step 372 is used to access the previous OMB entry 232 (ST=6), which would become the OMB entry examined in step 374. However, in this example, PWE field 268 is not null, but points to transaction AM for RT1=23 330, and processing passes to step 378. Upon each instance of finding in step 374 a PWE that is not null, in step 378 the first transaction pointed to be PWE, in the waveform for the OMB entry being examined (in this case, RT=23 330), is retrieved, and in step 380, the RT(this) of this OMB (the one selected in step 378, at this point, RT-23 330) is compared with the RT(1st); that is, with RT-18 340. If RT(this)<RT(1st), this block is marked for removal in step 381. In step 382 the PNE 332 of this transaction is examined. If PNE(this) is not null (which it isn't, at this point, inasmuch as PNE 332 points to transaction RT=25 334), in step 384 the RT of the next transaction in the transaction chain is retrieved (at this point, RT-23) and examined in step 380.

If in step 382, the PNE of the transaction is null (which it will be when processing reaches PNE 336), the end of the transaction chain has been reached, and processing returns to step 376 to locate using the PTRP field 262 the next previous OMB entry in the ST linked list, which in this case is element 232 having ST=6 and pointed to by line 263.

As soon as step 380 evaluates true, which it will upon reaching transaction RT=17 320, inasmuch as the entries are ordered by the RT as well as ST, the list need not be searched further, and processing proceeds to step 394. Blocks 394 and 396 assure that any blocks below transactions RT=17 320 will also be traversed. In this example, those transactions 330, 334 and 324 within the elements traversed 232, 234 which have RT's greater than the RT of the first transaction 340 in the waveform for the new element, are marked for cancellation. In this example, the transactions marked for cancellation are those for RT=23 330, RT=25 334, and RT=19 324.

In step 388, the list of canceled transactions is assigned to the OMB entry 236 for the new waveform. This is done by creating a phantom buffer 275 pointed to by PB field 276, as is represented by line 277 having element 228 for ST=7 and element 238 for element 280 (both elements 228 and 238 having been traversed above) and setting PRT fields 282, 292, PTRN fields 284, 294, PWE fields 288, 298 and PNE field 362 to link to these elements 228 and 238 their respective transactions have RT's greater than RT=18; that is, RT=19 350, RT=23 360 and RT=25 364.

In step 390, the pointers PTRP 272, PTRN 254 and PNE 322 of the remaining OMB entries 236, 232 are reset to regenerate the doubly linked list as illustrated in FIG. 8, with PTRP 272 set to point 273 to element ST=6 232; PTRN field 254 reset to point 257 to element ST=8 236. This removes element 260 from the linked list (it now appears in the phantom buffer at element 228), and transaction RT=19 324 from element ST=6 232 (which now appears in the phantom buffer as transaction 350 RT=19 linked by PWE 288 pointer 289 to element 238.) The elements 228, 238 in the phantom buffer are linked to element ST=8 270 by PWE field 278 and to each other by PTRP filed 292 and PTRN field 284. Fields PTRP 282, PB 286, PTRN 294, and PB 296 are set to null. PWE field 298 points 299 to transaction RT=23 360, the PNE field 362 of which points to transaction RT=25 364, the end of the chain (PNE 366 being null.)

Finally, in step 392, antimessages are sent to processor(s) of canceled entries 228, 238 and their associated transactions 350, 360 and 364. Whenever a transaction is put into the queue 275 pointed to by a PB (in this example, by PT 276, 277), an antimessage is sent to the processor which received the positive message for that transaction. In this example, an antimessage is sent for the positive message sent interprocessor or intraprocessor for the waveform elements associated with ST=7 290 (with RT=23 360 and RT=25 364) and for the waveform element at ST=6 280 with RT=19 350. As is explained in Jefferson, supra, for every message there exists an antimessage that is exacly like it in format and content except in one field, its sign. Two messages that are identical except for opposite signs are called antimessages of one another.

The OMB shown in FIG. 8, at the conclusion of manipulation through the process shown in FIG. 7 is still ordered by the ST as well as by the RT of the transactions.

The example illustrated in FIG. 8 only considers transport delay model. For inertial delay model, in steps 372–384, transactions are also examined in conjunction with their RT in the time window of [ST 270 of the simulated event, RT of the first transaction 340 of the newly generated waveform] which, in this example, would be the window ST=8, RT=18. Cancellation in this window would continue until the value of the new event matched the value of the event immediately preceding it. Events canceled because of inertial delay requirements are also saved on the phantom buffer. This inertial delay model, as described, responsive to insertion of a new event on a string of events, traverses back through the events until it finds the same event as the new event, and cancels all traversed events (which will have different values than the new event.)

During time warp simulation of VHDL models, an event can get rolled back. If the rolled back event did cancel transactions from an output waveform of the processor, then it is necessary to restore those transactions. For the example in FIG. 8, if event 236 at ST=8 270 is rolled back then it is necessary to restore all the transactions 360, 364 generated at ST=7 228 and transaction 350 generated at ST=6 280 with RT=19. As the transactions which are canceled due to a simulation of an event are associated with the event, it is very easy to restore them by executing the process set forth in FIG. 9.

Figure 9:
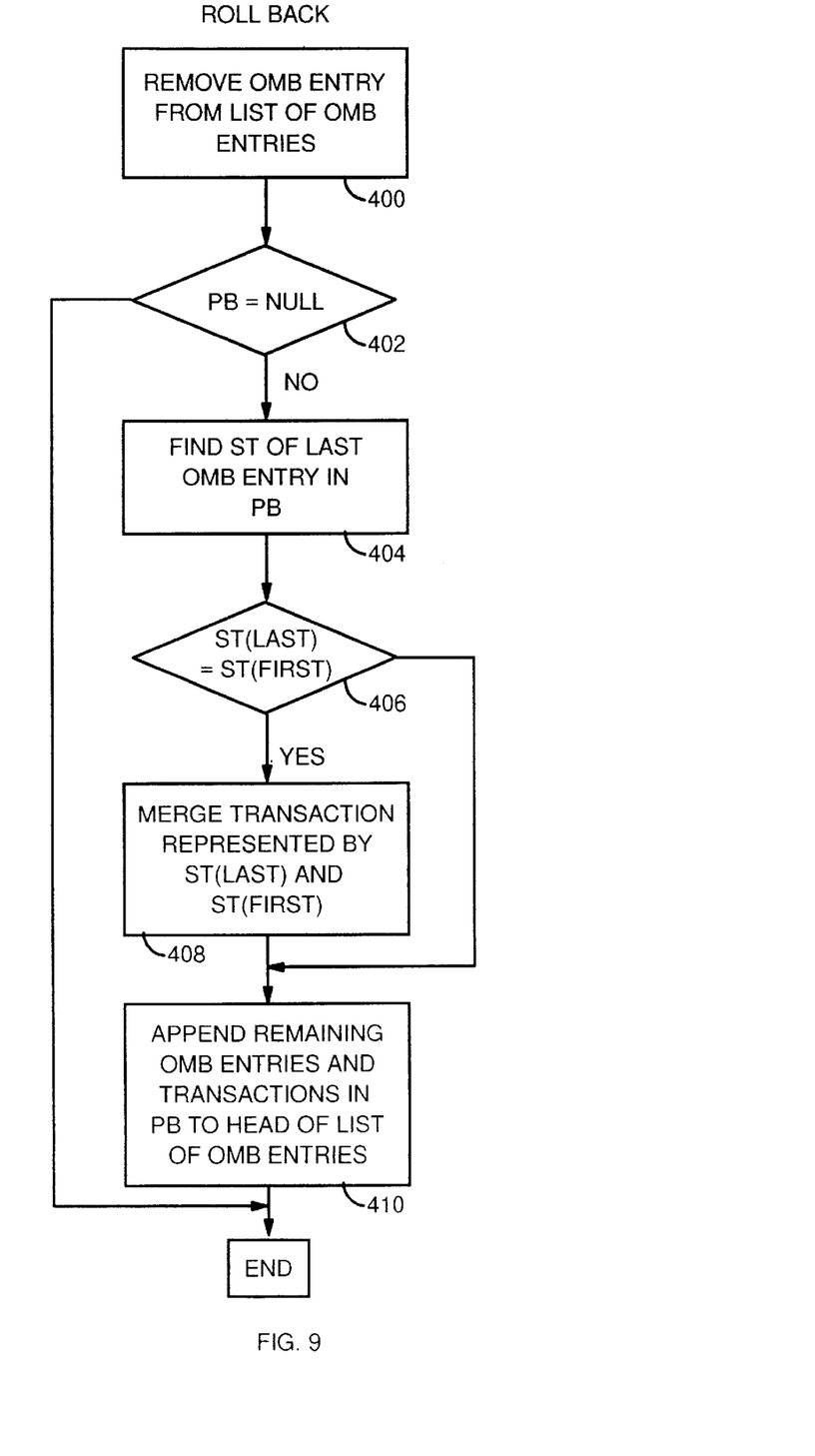
FIG. 9 is a flow chart of the method steps for rolling back an event.

Referring to FIG. 9 in connection with FIG. 8, in step 400 the OMB entry representing the rolled back event is removed from the list of OMB entries 230, 232, 234, 236. By way of example, let the rolled back entry be element 236. In step 402, PB field 276 of entry 236 is checked. If PB 276 is null, the phantom buffer is empty, and processing ends. If not, which in the example of FIG. 8 it is not, in step 404 the ST of the last entry in the phantom buffer 275 along the PRTP chain is found. In this example, the last entry is element 238, having ST=6 (the last, because PTRP 282 is null.)

In step 406, the ST of the last entry in the phantom buffer 275 (ST=6 280) is compared with the first entry in the OMB chain 265 (in this case, with ST=6 250, which is the first element 232 along the OMB chain starting from PTRP field 272 in the element 236 being removed.) If these ST's are equal, then in step 408 the transactions associated with them are merged. In this example, this step merges transactions RT=17 320 and RT=19 350 on element 232.

In step 410 the remaining OMB entries in phantom buffer 275 and associated transactions are appended to the head of the list of OMB entries 265. In this example, this means that OMB entry ST=7 and associated transactions RT=23 360 and RT=25 364 are appended to the head of OMB chain 265, resulting in restoring the structure illustrated in FIG. 6.

In as much as the entries in the phantom buffer 275 are ordered by ST along the PTRP and PTRN chains, as well as the RTs of the transactions, no extra processing is required to reorder them once they are appended to OMB 265.

The processes described above provide for the following cases. Case 1: insertion of new transaction(s) do not require any cancellation of previously posted transactions in OMB 265. Case 2: insertion of new transaction(s) requires cancellation of one or more previously scheduled transactions. Case 3: restoring of OMB entries from phantom buffer 275 to the OMB 265 due to the rollback of an event.

ADVANTAGES OVER THE PRIOR ART

During time warp simulation of VHDL models, simulation of an event on the input of a processor may schedule new transaction(s) on an output of the processor which may cancel previously scheduled transactions on the output. However, the event which scheduled the new transaction(s) on the output(s) may get rolled back and in such case the waveform of those output(s) must be restored. In accordance with this invention, a set of data structures and algorithms organizes the waveform for each output such that the transactions in the waveform are ordered by the simulation time (ST) of the events which created them as well as by the simulation time (RT) at which they are to be effective. This makes the manipulation of the waveform during forward simulation and during rollback very efficient.

ALTERNATIVE EMBODIMENTS

It will be appreciated that, although specific embodiments of the invention have been described herein for purposes of illustration, various modifications may be made without departing from the spirit and scope of the invention. In particular, it is within the scope of the invention to provide a memory device, such as a transmission medium, magnetic or optical tape or disc, or the like, for storing signals for controlling the operation of a computer according to the method of the invention and/or to structure its components in accordance with the system of the invention.

Accordingly, the scope of protection of this invention is limited only by the following claims and their equivalents.

We claim:

1. System for forward simulation and rollback during time warp simulation of waveform events representing devices which generate many periodic events into the future from a given input event, comprising:

a plurality of waveform elements, one for each output of a processor, each said waveform element represented by a waveform data structure including the simulation time of future events; and pointers ordering said waveform elements by the simulation time of said waveform events which created them and by the simulation time at which they are to be effective for selective forward simulation processing and rollback processing.

2. System structure for time warp simulation of waveform events representing devices which generate many periodic events into the future from a given input event, comprising for each said input event a waveform data structure, said waveform data structure including the simulation time of said input event, a linked list of said waveform data structures ordered by the simulation time at which they are to be effective, forward and reverse pointers for linking said waveform data structure for said each event to waveform data structures for any other events in a chain of events ordered by the simulation time of the events, and a phantom buffer pointer.

3. System structure for time warp simulation of events, comprising:

for each input event a waveform data structure for storing the output of a process which generates a plurality of timed events from a given said input event, said waveform data structure including the simulation time of said input event;

a linked list of said waveform data structures ordered by the simulation time at which they are to be effective, forward and reverse pointers for linking said waveform data structure for said each event to waveform data structures for any other events in a chain of events ordered by the simulation time of the events, and a phantom buffer pointer.

4. The system structure of claim 3 wherein said phantom buffer pointer accesses waveform data structures in a linked list of events and associated transactions canceled as a result of insertion of a new event in said chain of events.

5. The system structure of claim 4 further including a head pointer for locating the head of said chain of events.

6. Method for time warp simulation of events, comprising the steps of:

generating a plurality of waveform elements, one for each process which generates a plurality of periodic transactions into the future from a given input event, each said waveform element represented by a waveform data structure including the simulation time of future events;

ordering event waveform elements by the simulation time of events creating them in a forward and reverse linked chain of event waveform elements;

associating with each said event waveform element a linked list of said transactions ordered by the simulation time at which said transactions are to be effective; and inserting new event waveform elements into said chain of events and removing from said chain to a phantom buffer those event waveform elements and transactions to be effective after the first transaction of said new event waveform elements.

7. The method of claim 6, comprising the further step of rolling back a canceled event waveform element by restoring selected event waveform elements and transactions from said phantom buffer.

8. The method of claim 6, comprising the further step of removing to said phantom buffer those event waveform elements and transactions occurring within an inertial delay window.

9. A memory device for storing signals for controlling the operation of a computer for time warp simulation of events, according to the steps of:

generating a plurality of waveform elements, one for each process which generates a plurality of periodic transactions into the future from a given input event, each said waveform element represented by a waveform data structure including the simulation time of future events;

ordering event waveform elements by the simulation time of events creating them in a forward and reverse linked chain of events;

associating with each said event waveform element a linked list of said transactions ordered by the simulation time at which said transactions are to be effective; and inserting new event waveform elements into said chain of events and removing from said chain to a phantom buffer those event waveform elements and transactions to be effective after the first transaction of said new event waveform.

10. System for forward simulation and rollback during time warp simulation of events, comprising:

a plurality of waveform elements each representing a plurality of periodic coupled events generated from a given input event linked over time, one for each output of a processor, each said waveform element represented by a waveform data structure including the simulation time of future events; and pointers ordering said waveform elements by the simulation time of the events which created them and by the simulation time at which they are to be effective for selective forward simulation processing and rollback processing.

11. System for forward simulation and rollback during time warp simulation of events, comprising:

a plurality of waveform elements each representing a plurality of periodic events generated from an input event, one for each output from a process, each said element being a value/simulation-time tuple representing the value of an output of a process at one of a plurality of future simulation times, each said waveform element represented by a waveform data structure including the simulation time of future events; and pointers ordering said waveform elements by the simulation time of said input events which created them and by the simulation time at which they are to be effective for selective forward simulation processing and rollback processing.

12. System for forward simulation and rollback during time warp simulation of events, comprising:

a plurality of waveform elements, one for each output of a processor which generates a plurality of periodic events into the future from a single input event, each said waveform element represented by a waveform data structure including the simulation time of future events; and pointers ordering said waveform elements by the simulation time of the events which created them and by the simulation time at which they are to be effective for selective forward simulation processing and rollback processing.

13. An article of manufacture comprising:

a computer useable medium having computer readable program code means embodied therein for time warp simulation of events, the computer readable program means in said article of manufacture comprising:

computer readable program code means for causing a computer to effect generating a plurality of waveform elements, one for each process which generates a plurality of periodic transactions into the future from a given input event, each said waveform element represented by a waveform data structure including the simulation time of future events;

computer readable program code means for causing a computer to effect ordering event waveform elements by the simulation time of events creating them in a forward and reverse linked chain of events;

computer readable program code means for causing a computer to effect associating with each said event waveform element a linked list of said transactions ordered by the simulation time at which said transactions are to be effective; and computer readable program code means for causing a computer to effect inserting new event waveform elements into said chain of events and removing from said chain to a phantom buffer those event waveform elements and transactions to be effective after the first transaction of said new event waveform.

14. A computer program product or computer program element for time warp simulation of events according to the method steps comprising:

generating a plurality of waveform elements, one for each process which generates a plurality of periodic transactions into the future from a given input event, each said waveform element represented by a waveform data structure including the simulation time of future events;

ordering event waveform elements by the simulation time of events creating them in a forward and reverse linked chain of events;

associating with each said event waveform element a linked list of said transactions ordered by the simulation time at which said transactions are to be effective; and inserting new event waveform elements into said chain of events and removing from said chain to a phantom buffer those event waveform elements and transactions to be effective after the first transaction of said new event waveform.

* * * * *